United States Patent
Maute

(10) Patent No.: US 9,627,587 B2
(45) Date of Patent: Apr. 18, 2017

(54) RADIATION-EMITTING SEMICONDUCTOR CHIP COMPRISING A STRUCTURED MIRROR LAYER WHICH IS ELECTRICALLY NON-CONDUCTIVE DURING OPERATION

(71) Applicant: OSRAM Opto Semiconductors GmbH, Regensburg (DE)

(72) Inventor: Markus Maute, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/779,940

(22) PCT Filed: Mar. 20, 2014

(86) PCT No.: PCT/EP2014/055637
§ 371 (c)(1),
(2) Date: Sep. 24, 2015

(87) PCT Pub. No.: WO2014/154566
PCT Pub. Date: Oct. 2, 2014

(65) Prior Publication Data
US 2016/0049556 A1 Feb. 18, 2016

(30) Foreign Application Priority Data

Mar. 28, 2013 (DE) .......................... 10 2013 103 216

(51) Int. Cl.
*H01L 33/46* (2010.01)
*H01L 33/40* (2010.01)
(Continued)

(52) U.S. Cl.
CPC ............ *H01L 33/46* (2013.01); *H01L 33/405* (2013.01); *H01L 33/44* (2013.01); *H01L 33/54* (2013.01);
(Continued)

(58) Field of Classification Search
None
See application file for complete search history.

(56) References Cited

U.S. PATENT DOCUMENTS 7,141,825 B2 * 11/2006 Horio ...................... H01L 33/40
257/79
8,735,924 B2 * 5/2014 Totani ...................... H01L 33/38
257/13
(Continued)

FOREIGN PATENT DOCUMENTS

DE 102007004302 A1 4/2008
DE 102010035966 A1 3/2012
(Continued)

*Primary Examiner* — Bilkis Jahan
(74) *Attorney, Agent, or Firm* — McDermott Will & Emery LLP

(57) ABSTRACT

A radiation-emitting semiconductor chip (1) is specified, comprising—a semiconductor layer sequence (2) having a first main surface (3) and a second main surface (4) situated opposite the first main surface (3) wherein the semiconductor layer sequence (2) has an active zone (5) suitable for generating electromagnetic radiation, —a structured mirror layer (6), which is electrically non-conductive during operation and is arranged on the side of the first main surface (3) of the semiconductor layer sequence (2), wherein the mirror layer (6) has at least one mirror region (6A, 6B, 6C) which regionally covers the first main surface (3), —at least one encapsulation region (7A, 7B, 7C) which surrounds the at least one mirror region (6A, 6B, 6C) on all sides and is in direct contact with the mirror region (6A, 6B, 6C), wherein (Continued)

Figure 1:
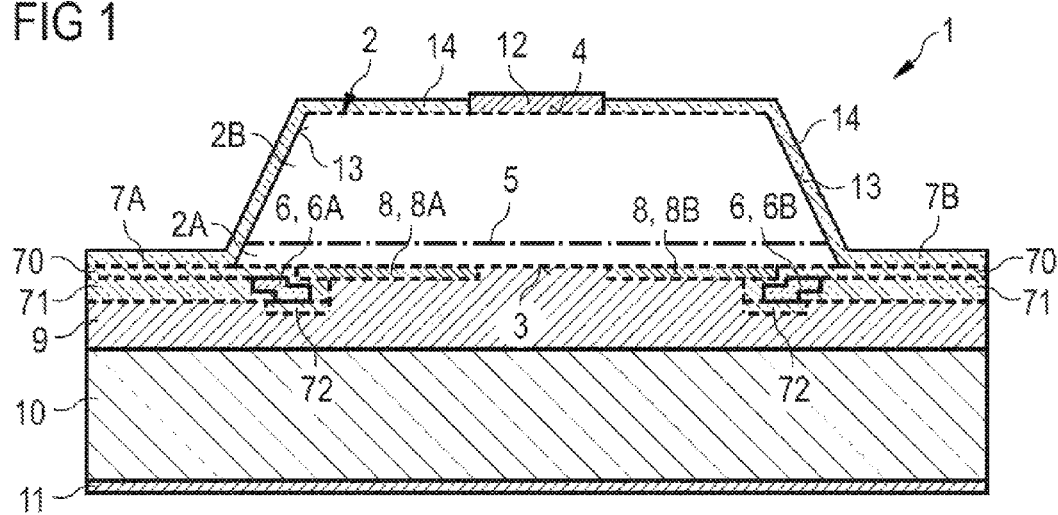

the at least one encapsulation region (7A, 7B, 7C); is electrically non-conductive during operation.

14 Claims, 2 Drawing Sheets

(51) Int. Cl.
    *H01L 33/44*     (2010.01)
    *H01L 33/54*     (2010.01)
    *H01L 33/62*     (2010.01)
    *H01L 33/14*     (2010.01)
    *H01L 33/38*     (2010.01)

(52) U.S. Cl.
    CPC ............ *H01L 33/62* (2013.01); *H01L 33/145* (2013.01); *H01L 33/38* (2013.01)

(56) References Cited

U.S. PATENT DOCUMENTS

| | | | |
|---|---|---|---|
| 2003/0168664 A1* | 9/2003 | Hahn | H01L 33/0079 257/79 |
| 2006/0011923 A1* | 1/2006 | Eisert | H01L 33/22 257/77 |
| 2007/0102711 A1 | 5/2007 | Aoyagi et al. | |
| 2007/0131956 A1 | 6/2007 | Lin | |
| 2009/0146165 A1* | 6/2009 | Hasnain | H01L 33/382 257/98 |
| 2010/0155746 A1* | 6/2010 | Ibbetson | H01L 25/0753 257/88 |
| 2010/0295073 A1* | 11/2010 | Grotsch | H01L 33/405 257/98 |
| 2012/0032144 A1 | 2/2012 | Fudeta | |
| 2012/0223345 A1* | 9/2012 | Tomoda | H01L 25/0753 257/89 |
| 2012/0241720 A1* | 9/2012 | Totani | H01L 33/382 257/13 |

FOREIGN PATENT DOCUMENTS

| | | |
|---|---|---|
| EP | 2219240 A2 | 8/2010 |
| EP | 2495761 A2 | 9/2012 |
| WO | 2009/140939 A2 | 11/2009 |
| WO | 2012/028511 A1 | 3/2012 |
| WO | 2013/030094 A1 | 3/2013 |

* cited by examiner

RADIATION-EMITTING SEMICONDUCTOR CHIP COMPRISING A STRUCTURED MIRROR LAYER WHICH IS ELECTRICALLY NON-CONDUCTIVE DURING OPERATION

A radiation-emitting semiconductor chip is specified which comprises a semiconductor layer sequence having an active zone suitable for generating electromagnetic radiation.

Light-emitting diode chips for light-emitting diodes (LEDs) can comprise a reflective layer in order to reduce radiation losses caused by radiation-absorbing regions in the chip. With the use of a reflective material such as silver there is the risk of silver ions arising in a moist environment, which ions, in the presence of an electric field, can migrate and lead to leakage currents in particular in edge regions of the light-emitting diode chips.

One object to be achieved is to specify a radiation-emitting semiconductor chip which is comparatively moisture-stable.

This object is achieved by means of a radiation-emitting semiconductor chip comprising the features of the independent patent claim.

In accordance with at least one embodiment, the radiation-emitting semiconductor chip comprises a semiconductor layer sequence having a first main surface, a second main surface situated opposite the first main surface, and an active zone suitable for generating electromagnetic radiation. Preferably, the radiation generated by the active zone is coupled out at least partly at the second main surface. Furthermore, at least part of the radiation can be coupled out at side surfaces of the semiconductor layer sequence.

Furthermore, the radiation-emitting semiconductor chip comprises a structured mirror layer, which is electrically non-conductive during operation and is arranged on the side of the first main surface of the semiconductor layer sequence, wherein the mirror layer has at least one mirror region which covers the first main surface in regions. The structured mirror layer is in particular not a homogeneous layer but rather an interrupted layer having one or a plurality of mirror regions as a result of its structuring.

Furthermore, the radiation-emitting semiconductor chip comprises at least one encapsulation region which surrounds the at least one mirror region on all sides and is in direct contact with the mirror region, wherein the at least one encapsulation region is electrically non-conductive during operation. In this case, "in direct contact" means that the mirror region and the encapsulation region have a common interface. Advantageously, the at least one mirror region is potential-free as a result of the embedding into the encapsulation region which is electrically non-conductive during operation, such that no ions can arise and migrate.

In one preferred embodiment, the non-conductive mirror layer contains an electrically conductive material. Preferably, the non-conductive mirror layer comprises one or a plurality of metals or is formed from a metal. Suitable metals are silver or gold, for example. In particular, the non-conductive mirror layer consists of silver. By way of example, silver is distinguished by a high reflection in the visible spectral range.

In accordance with at least one embodiment, a first non-conductive mirror region embedded into a first non-conductive encapsulation region covers a first edge region of the semiconductor layer sequence. Preferably, a second non-conductive mirror region embedded into a second non-conductive encapsulation region covers a second edge region of the semiconductor layer sequence, said second edge region being different from the first edge region. Advantageously, leakage currents in the edge region can be reduced or even prevented by the encapsulated mirror regions at the edge. At the same time, the absorption in the edge region can be reduced by the mirror regions at the edge.

In accordance with at least one embodiment, the at least one mirror region extends at most as far as a chip edge delimiting the first main surface. By avoiding an overhang of the mirror region, it is possible to further reduce the risk of leakage currents.

In accordance with at least one embodiment, the at least one mirror region projects beyond a chip edge delimiting the first main surface. This enables an improved reflection of radiation at the edge.

In accordance with at least one embodiment, the mirror layer which is electrically non-conductive during operation has a third mirror region embedded into a third encapsulation region. Said third mirror region is preferably arranged at the first main surface between the first and the second, encapsulated mirror region and covers a central region of the semiconductor layer sequence. In particular, the third encapsulated mirror region is arranged below a radiation-absorbing top-side contact. The third encapsulation region can advantageously reduce current injection into the semiconductor layer sequence, such that no appreciable radiation is generated below the top-side contact. At the same time, the third mirror region reflects impinging radiation with high reflectivity.

In accordance with at least one embodiment, the encapsulation region which is electrically non-conductive during operation contains an electrically insulating material. What can advantageously be achieved by means of the encapsulation region thus formed is that no appreciable current flows through the mirror region during operation.

Preferably, the encapsulation region is transmissive for the radiation emitted by the active zone. As a result, advantageously only slight radiation losses caused by absorption arise in the encapsulation region.

The encapsulation region can comprise for example a silicon oxide, a silicon nitride, a silicon oxynitride or an aluminum oxide. Particularly preferably, the encapsulation region is formed from $SiO_2$.

In one preferred configuration, the encapsulation region comprises an encapsulation layer which is electrically non-conductive during operation and which is arranged between the semiconductor layer sequence and the mirror region. The encapsulation region can comprise a further encapsulation layer which is electrically non-conductive during operation and which laterally encloses the mirror region. Finally, the encapsulation region can comprise an encapsulation layer which is electrically non-conductive during operation and which is arranged on a surface of the mirror region facing away from the first main surface.

In accordance with at least one embodiment, the encapsulation layer arranged between the semiconductor layer sequence and the mirror region is thicker than the encapsulation layer facing away from the first main surface since the risk of leakage currents is greater in the region of the chip edge than on an underside of the semiconductor chip. The thicker encapsulation layer has, in particular, a thickness of between 100 nm and 200 nm. The thinner encapsulation layer has, in particular, a thickness of between 5 nm and 50 nm.

In accordance with at least one embodiment, the radiation-emitting semiconductor chip furthermore comprises a structured mirror layer, which is electrically conductive during operation. Preferably, the structured mirror layer which is electrically conductive during operation is arranged on the side of the first main surface of the semiconductor layer sequence. In particular, the mirror layer comprises at least one mirror region which covers the first main surface in regions. The electrically conductive mirror layer is provided in particular for current injection into the semiconductor layer sequence.

In one preferred embodiment, the electrically conductive mirror layer contains an electrically conductive material. Preferably, the electrically conductive mirror layer comprises one or a plurality of metals or is formed from a metal. In particular, the mirror layer consists of silver. The conductive mirror layer can be formed from the same material as the electrically non-conductive mirror layer.

In one advantageous configuration, the radiation-emitting semiconductor chip additionally comprises an encapsulation layer which is electrically conductive during operation and which is in direct contact with the mirror region of the electrically conductive mirror layer on a side of the mirror region facing away from the first main surface. Advantageously, current can be injected into the semiconductor layer sequence by means of the electrically conductive mirror layer and by means of the electrically conductive encapsulation layer. In particular, the electrically conductive encapsulation layer can be constructed in a multilayered fashion. By way of example, the encapsulation layer can comprise a diffusion barrier layer and a solder metal layer. The diffusion barrier layer is provided for example for preventing the diffusion of constituents of subsequent layers into the conductive mirror layer, and vice versa. One suitable material for the diffusion barrier layer is TiWN, for example. The solder metal layer is provided, for example, for connecting the semiconductor layer sequence to a carrier element. The solder metal layer can be formed from AuSn, in particular.

In accordance with at least one embodiment, the mirror regions of the mirror layer which is electrically non-conductive during operation and of the mirror layer which is electrically conductive during operation are arranged in a manner offset with respect to one another along the first main surface. In particular, the mirror regions of the mirror layer which is electrically non-conductive during operation and of the mirror layer which is electrically conductive during operation cover substantially different regions of the first main surface. In order, however, to ensure an uninterrupted reflective coating of the first main surface, the mirror regions are preferably arranged in an overlapping fashion.

In one advantageous configuration, the two mirror layers are arranged one above another proceeding from the semiconductor layer sequence. In particular, the electrically conductive mirror layer succeeds the semiconductor layer sequence. The electrically non-conductive mirror layer then succeeds the electrically conductive mirror layer.

In particular, the electrically conductive mirror layer has interruptions in the regions where it is covered by mirror regions of the electrically non-conductive mirror layer. Furthermore, the electrically non-conductive mirror layer preferably has interruptions in the regions where it is covered by mirror regions of the electrically conductive mirror layer.

In accordance with at least one embodiment, the radiation-emitting semiconductor chip furthermore comprises a carrier element, on which the semiconductor layer sequence is arranged. Preferably, the carrier element is electrically conductive during operation. Consequently, current can be injected into the semiconductor layer sequence via the carrier element during operation. Suitable materials for the carrier element are Ge and Si, for example.

In one preferred configuration, the structured mirror layer that is electrically non-conductive during operation is arranged between the semiconductor layer sequence and the carrier element. Radiation emitted by the active zone in the direction of the carrier element can advantageously be deflected in the direction of the second main surface and the side surfaces which are provided for coupling out radiation.

In accordance with at least one embodiment, the radiation-emitting semiconductor chip furthermore comprises a rear-side contact arranged on a surface of the carrier element facing away from the semiconductor layer sequence. The rear-side contact can be a metalization that completely covers said surface of the carrier element. In particular, the rear-side contact is a p-type contact. In other words, the rear-side contact is provided in particular for the electrical connection of a p-conducting region of the semiconductor layer sequence.

In accordance with at least one embodiment, the radiation-emitting semiconductor chip furthermore comprises a top-side contact arranged on the second main surface of the semiconductor layer sequence. In particular, the top-side contact is an n-type contact. This means that the top-side contact is provided in particular for the electrical connection of an n-conducting region of the semiconductor layer sequence.

In accordance with at least one embodiment, the radiation-emitting semiconductor chip is a thin-film semiconductor chip. This means, for example, that the carrier element, on which the semiconductor layer sequence is arranged, is different from a growth substrate used for the production of the semiconductor layer sequence, said growth substrate being removed from the semiconductor layer sequence at least partly, in particular completely.

In one preferred configuration, the semiconductor layer sequence is embodied in a mesa-shaped fashion and has obliquely extending side flanks. By way of example, the semiconductor layer sequence can have the shape of a truncated pyramid. Advantageously, this shaping makes it possible to improve the coupling-out of radiation at the side surfaces in comparison with perpendicularly extending side surfaces.

In accordance with at least one embodiment of a method for producing a radiation-emitting semiconductor chip as described above, a semiconductor layer sequence is grown on a growth substrate.

Furthermore, a structured electrically conductive mirror layer is produced on a first main surface of the semiconductor layer sequence, said mirror layer being provided for injecting current into the semiconductor layer sequence during operation.

A further structured mirror layer, which is not provided for injecting current into the semiconductor layer sequence during operation, is then produced on the mirror layer. The further structured mirror layer is encapsulated, such that each mirror region is completely embedded into an encapsulation region. In particular, an electrically insulating, radiation-transmissive encapsulation material is used for the encapsulation region.

In accordance with at least one embodiment, at least one encapsulation layer of the non-conductive encapsulation region is formed by means of an ALD method (atomic layer deposition). Very thin layers having a polycrystalline or amorphous structure can be produced by means of an ALD method. Moreover, particularly uniform layers, that is to say layers of particularly uniform thickness, can be produced by means of the ALD method. Preferably, the thinner encapsulation layer facing away from the first main surface is produced by means of an ALD method. The thicker encapsulation layer facing the first main surface is furthermore preferably produced by means of a CVD (chemical vapor deposition) method.

Furthermore, an encapsulation layer that is electrically conductive during operation can be arranged on the mirror layers. The encapsulation layer is preferably embodied in a multilayered fashion and can contain different metals.

The semiconductor layer sequence with the layers applied thereto can be transferred to a carrier element, such that the mirror layer is arranged between the carrier element and the semiconductor layer sequence.

Preferably, the growth substrate on which the semiconductor layer sequence was grown is thinned or completely removed, such that the finished semiconductor chip is in particular free of a growth substrate.

The side surfaces of the semiconductor layer sequence can be beveled, such that the semiconductor layer sequence has the shape of a truncated pyramid, in particular.

The uncovered surfaces of the semiconductor layer sequence can subsequently be covered with a passivation layer.

The described features and embodiments for the radiation-emitting semiconductor chip equally also apply to the method for producing the radiation-emitting semiconductor chip, and vice versa.

Further advantages and advantageous embodiments and developments will become apparent from the embodiments described below in association with FIGS. 1 to 3.

Figure 2:
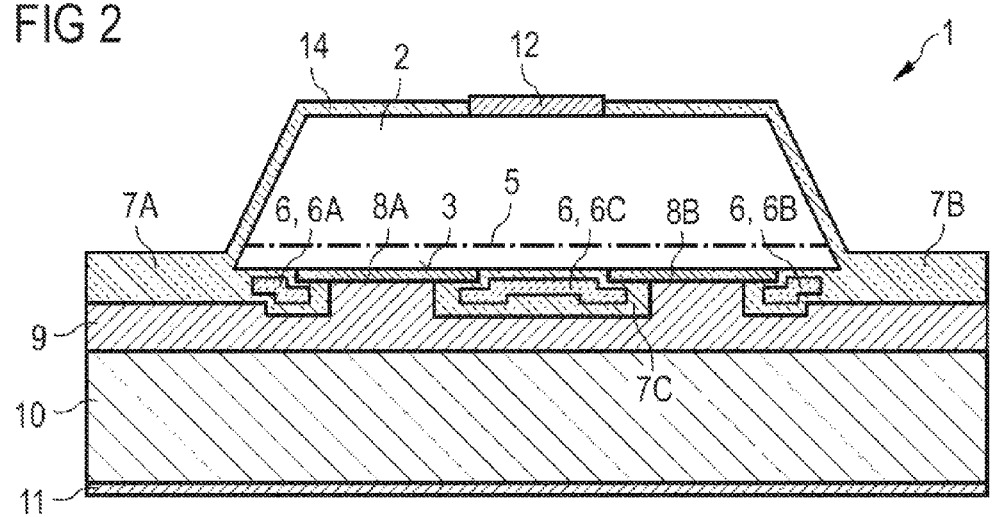
Figure 3:
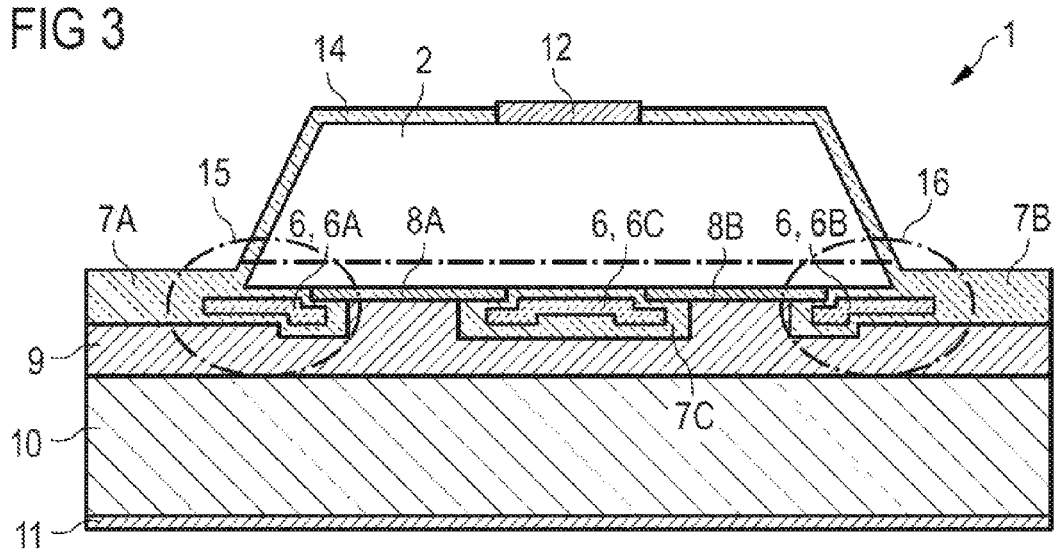

In the figures:

FIGS. 1 to 3 show schematic cross-sectional views of radiation-emitting semiconductor chips in accordance with various exemplary embodiments.

FIG. 1 illustrates a radiation-emitting semiconductor chip 1 comprising a semiconductor layer sequence 2 having a first main surface 3 and a second main surface 4 situated opposite the first main surface 3. A top-side contact 12 is arranged on the second main surface 4.

The two main surfaces 3, 4 are connected to one another by obliquely extending side surfaces 13. The side surfaces 13 are covered by a protective passivation layer 14. The second main surface 4, too, is covered at least partly by the protective passivation layer 14. The passivation layer 14 is, in particular, electrically insulating and radiation-transmissive.

The semiconductor layer sequence 2 has an active zone 5 suitable for generating electromagnetic radiation. In particular, the active zone 5 is suitable for emitting electromagnetic radiation in the visible spectral range. The semiconductor layer sequence 2 or at least one layer thereof can comprise a III nitride compound semiconductor material, preferably $In_xAl_yGa_{1-x-y}N$, wherein $0 \le x \le 1$, $0 \le y \le 1$ and $x+y \le 1$.

The active zone 5 is situated between a first semiconductor region 2A of first conductivity arranged at the first main surface 3 and a second semiconductor region 2B of second conductivity arranged at the second main surface 4. The first semiconductor region 2A is preferably p-conducting. The second semiconductor region 2B is furthermore preferably n-conducting. Current can be injected into the second semiconductor region 2B by means of the top-side contact 12.

The light-emitting diode chip 1 emits electromagnetic radiation 13 through the second main surface 4 and the side surfaces 13. In order to improve the coupling-out of radiation, the second main surface 4 and/or the side surfaces 13 can be provided with a roughening or a coupling-out structure (not illustrated).

On the side of the first main surface 3, the radiation-emitting semiconductor chip 1 comprises a structured mirror layer 6. The structured mirror layer 6 is electrically non-conductive during operation. In the exemplary embodiment illustrated, the mirror layer 6 has a first mirror region 6A and a second mirror region 6B, which cover the first main surface 3 in regions. In a plan view of the semiconductor chip 1, the mirror regions 6A, 6B can be embodied in a continuous fashion or can be interrupted by an interspace. In particular, the mirror layer 6 forms a closed ring in plan view.

Preferably, the mirror layer 6 is electrically conductive and advantageously has a reflectivity of at least 80%, preferably of at least 90%. In particular, the mirror layer 6 comprises one or a plurality of metals or is formed from a metal. Suitable metals are silver or gold, for example. The mirror layer 6 advantageously consists of silver, which is distinguished by a high reflection in the visible spectral range.

The two mirror regions 6A, 6B are respectively completely embedded into an encapsulation region 7A, 7B. That is to say that the mirror regions 6A, 6B are respectively enclosed by the encapsulation regions 7A, 7B on all sides and are in direct contact therewith, which means that the mirror regions 6A, 6B and the encapsulation regions 7A, 7B respectively have a common interface. The encapsulation regions 7A, 7B are electrically non-conductive during operation. In particular, the encapsulation regions 7A, 7B contain an electrically insulating material such as $SiO_2$. Consequently, the mirror regions 6A, 6B are electrically insulated by the encapsulation regions 7A, 7B and are thus electrically non-conductive during operation. Furthermore, the encapsulation material is advantageously transmissive for the radiation emitted by the active zone 5, such that comparatively little radiation is absorbed by the encapsulation regions 7A, 7B.

The non-conductive encapsulation regions 7A, 7B can be composed of a plurality of layers. By way of example, a first non-conductive encapsulation layer 70 can be arranged between the semiconductor layer sequence 2 and the non-conductive mirror layer 6. A second non-conductive encapsulation layer 71 can laterally enclose the mirror regions 6A, 6B. A third non-conductive encapsulation layer 72 can be arranged on surfaces of the mirror regions 6A, 6B which face away from the first main surface 3.

The first encapsulated mirror region 6A covers a first edge region of the semiconductor layer sequence 2. The second encapsulated mirror region 6B covers a second edge region of the semiconductor layer sequence 2, said second edge region being different from the first edge region. Advantageously, leakage currents that arise for example as a result of migration of metal ions of the mirror layer 6 can be suppressed in said edge regions. At the same time, a high reflectivity can be obtained by means of the mirror layer 6 in the edge regions.

The mirror regions 6A, 6B do not project beyond a chip edge delimiting the first main surface 3. By avoiding an overhang, it is possible to further reduce the risk of leakage currents.

The radiation-emitting semiconductor chip 1 furthermore comprises a structured mirror layer 8, which is electrically conductive during operation and which is arranged on the side of the first main surface 3 of the semiconductor layer sequence 2. In this exemplary embodiment, the mirror layer 8 has two mirror regions 8A, 8B, which cover the first main surface 3 in regions. In a plan view of the semiconductor chip 1, the mirror regions 8A, 8B can be embodied in a continuous fashion or can be interrupted by an interspace. In particular, the mirror layer 8 forms a closed ring in plan view. In particular, the same materials as for the non-conductive mirror layer 6 are suitable for the electrically conductive mirror layer 8.

The two mirror layers 6, 8 are arranged one on top of the other, wherein the conductive mirror layer 8 is situated nearer to the semiconductor layer sequence 2 than the non-conductive mirror layer 6.

The mirror regions 6A, 6B, 8A, 8B of the non-conductive and conductive mirror layers 6, 8 are arranged in a manner offset with respect to one another along the first main surface 3. However, in order to ensure an uninterrupted reflective coating of the first main surface 3, the mirror regions 6A, 6B, 8A, 8B are arranged in a laterally overlapping fashion. In other words, the electrically conductive mirror layer 8 has interruptions in the regions where it is covered by mirror regions (6A, 6B, 6C) of the electrically non-conductive mirror layer 6. Furthermore, the electrically non-conductive mirror layer 6 has interruptions in the regions where it is covered by mirror regions 8A, 8B of the electrically conductive mirror layer 8.

On a side facing away from the first main surface 3, the mirror regions 8A, 8B are in direct contact with an encapsulation layer 9 that is electrically conductive during operation. In this exemplary embodiment, the encapsulation layer 9 fills an interspace between the two conductive mirror regions 8A, 8B and is in direct contact with the semiconductor layer sequence 2. Furthermore, the encapsulation layer 9 is arranged on side surfaces and rear-side surfaces of the non-conductive encapsulation regions 7A, 7B.

Current can be injected into the first semiconductor region 2A by means of the conductive mirror regions 8A, 8B and the conductive encapsulation layer 9.

The electrically conductive encapsulation layer 9 can be constructed in a multilayered fashion. By way of example, the encapsulation layer 9 can comprise a diffusion barrier layer (not illustrated) and a solder metal layer (not illustrated). The diffusion barrier layer is provided for preventing the diffusion of constituents of subsequent layers into the encapsulation regions 7A, 7B or into the mirror layer 8, and vice versa. One suitable material for the diffusion barrier layer is TiWN, for example. The solder metal layer is provided for connecting the semiconductor layer sequence to a carrier element 10. The solder metal layer can be formed from AuSn, in particular.

The contact resistance at the junction between the encapsulation layer 9 and the semiconductor layer sequence 2 can be greater than the contact resistance at the junction between the mirror layer 8 and the semiconductor layer sequence 2, such that in a central region of the first semiconductor layer sequence 2, in which central region a radiation-absorbing top-side contact 12 is situated, less current is injected than in the mirror regions 8A, 8B.

The semiconductor layer sequence 2 is arranged on a carrier element 10, which in particular is different from a growth substrate and has improved electrical and/or thermal properties by comparison therewith. In particular, the carrier element 10 can be formed from Si or Ge. The carrier element 10 projects beyond the semiconductor layer sequence 2 on all sides. The encapsulation regions 7A, 7B extend right onto regions of the carrier element 10 which are not covered by the semiconductor layer sequence 2. Consequently, the semiconductor chip 1 is laterally partly protected by the encapsulation regions 7A, 7B and by the passivation layer 14.

A rear-side contact 11 is applied to the carrier element 10. Current can be injected into the semiconductor chip 1 by means of the rear-side contact 11 and the top-side contact 12, which are situated on different sides of the semiconductor chip 1.

The radiation-emitting semiconductor chip 1 illustrated in FIG. 2 has a similar construction to the radiation-emitting semiconductor chip 1 illustrated in FIG. 1. However, the mirror layer 6 in accordance with the second exemplary embodiment has a third mirror region 6C, which is electrically non-conductive during operation. The third mirror region 6C is arranged at the first main surface 3 between the first and second mirror regions 6A, 6B. The mirror region 6C is completely embedded into an encapsulation region 7C that is electrically non-conductive during operation. The third encapsulated mirror region 6C is arranged in a central region of the first main surface 3. Furthermore, the third encapsulated mirror region 6C is arranged below the top-side contact 12. The encapsulation region 7C prevents current from being injected into the semiconductor layer sequence 2 in this central region, such that little radiation is generated below the top-side contact 12. At the same time, the semiconductor chip 1 in accordance with the second exemplary embodiment has a higher reflectivity in the central region in comparison with the first exemplary embodiment, on account of the third mirror region 6C.

The radiation-emitting semiconductor chip 1 illustrated in FIG. 3 has a similar construction to the radiation-emitting semiconductor chip 1 illustrated in FIG. 2. However, the non-conductive mirror layer 6 in this exemplary embodiment has a first and second mirror region 6A, 6B, which both project beyond the chip edge of the semiconductor layer sequence 2 in the edge region 15, 16. This enables an improved reflection of radiation at the edge.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102013103216.8, the disclosure content of which is hereby incorporated by reference.

The invention claimed is:

1. A radiation-emitting semiconductor chip, comprising:
   a semiconductor layer sequence having a first main surface and a second main surface situated opposite the first main surface, wherein the semiconductor layer sequence has an active zone suitable for generating electromagnetic radiation;
   a structured mirror layer, which is electrically non-conductive during operation and is arranged on the side of the first main surface of the semiconductor layer sequence, wherein the mirror layer has at least one mirror region which covers the first main surface in regions;
   at least one encapsulation region which surrounds the at least one mirror region on all sides and is in direct contact with the mirror region, wherein the at least one encapsulation region is electrically non-conductive during operation;
   a structured mirror layer, which is electrically conductive during operation and which is arranged on the side of the first main surface of the semiconductor layer sequence and comprises at least one mirror region which covers the first main surface in regions; and an encapsulation layer which is electrically conductive during operation and which is in direct contact with the mirror region on a side of the mirror region facing away from the first main surface.

2. The radiation-emitting semiconductor chip according to claim 1, wherein a first mirror region embedded into a first encapsulation region covers a first edge region of the semiconductor layer sequence and a second mirror region embedded into a second encapsulation region covers a second edge region of the semiconductor layer sequence, the second edge region being different from the first edge region.

3. The radiation-emitting semiconductor chip according to claim 1, wherein the at least one mirror region extends at most as far as a chip edge delimiting the first main surface.

4. The radiation-emitting semiconductor chip according to claim 1, wherein the at least one mirror region projects beyond a chip edge delimiting the first main surface.

5. The radiation-emitting semiconductor chip according to claim 2, wherein a third mirror region embedded into a third encapsulation region is arranged at the first main surface between the first and second mirror regions and covers a central region of the semiconductor layer sequence.

6. The radiation-emitting semiconductor chip according to claim 1, wherein the non-conductive encapsulation region contains an electrically insulating material and is transmissive for the radiation emitted by the active zone.

7. The radiation-emitting semiconductor chip according to claim 1, wherein the non-conductive encapsulation region comprises an encapsulation layer which is electrically non-conductive during operation and which is arranged between the semiconductor layer sequence and the mirror region.

8. The radiation-emitting semiconductor chip according to claim 1, wherein the encapsulation region comprises an encapsulation layer which is electrically non-conductive during operation and which laterally encloses the mirror region.

9. The radiation-emitting semiconductor chip according to claim 1, wherein the encapsulation region comprises an encapsulation layer which is electrically non-conductive during operation and which is arranged on a surface of the mirror region facing away from the first main surface.

10. The radiation-emitting semiconductor chip according to claim 1, wherein the mirror regions of the mirror layer which is electrically non-conductive during operation and of the mirror layer which is electrically conductive are arranged in a manner offset with respect to one another along the first main surface.

11. The radiation-emitting semiconductor chip according to claim 1, wherein the electrically conductive mirror layer has interruptions in the regions where it is covered by mirror regions of the electrically non-conductive mirror layer, and wherein the electrically non-conductive mirror layer has interruptions in the regions where it is covered by mirror regions of the electrically conductive mirror layer.

12. The radiation-emitting semiconductor chip according to claim 1, wherein at least one of the mirror layers is formed from a metal.

13. The radiation-emitting semiconductor chip according to claim 1, further comprising:

a carrier element, which is electrically conductive during operation and on which the semiconductor layer sequence is arranged, wherein the structured mirror layer which is electrically non-conductive during operation is arranged between the semiconductor layer sequence and the carrier element; and a rear-side contact arranged on a surface of the carrier element facing away from the semiconductor layer sequence.

14. The radiation-emitting semiconductor chip according to claim 5, wherein a top-side contact is arranged on the second main surface of the semiconductor layer sequence, which top-side contact, upon projection into a plane of the third mirror region, does not project beyond the latter at any side.

* * * * *